United States Patent [19]
Ismail et al.

[11] Patent Number: 6,008,113
[45] Date of Patent: Dec. 28, 1999

[54] PROCESS FOR WAFER BONDING IN A VACUUM

[75] Inventors: M. Salleh Ismail, Moorpark; Jeffrey K. Wong, Simi Valley, both of Calif.

[73] Assignee: Kavlico Corporation, Moorpark, Calif.

[21] Appl. No.: 09/081,696

[22] Filed: May 19, 1998

[51] Int. Cl.$^6$ .................................................. H01L 21/44

[52] U.S. Cl. ........................ 438/615; 438/455; 438/612; 438/613

[58] Field of Search ................................. 438/615, 613, 438/612, 455

[56] References Cited

U.S. PATENT DOCUMENTS

| | | | |
|---|---|---|---|
| 4,883,215 | 11/1989 | Goesele et al. | 228/116 |
| 5,010,036 | 4/1991 | Calviello et al. | 438/106 |
| 5,236,118 | 8/1993 | Bower et al. | 438/108 |
| 5,451,274 | 9/1995 | Gupta | 438/615 |
| 5,576,251 | 11/1996 | Garabedian et al. | 437/228 |

*Primary Examiner*—Kevin M. Picardat
*Assistant Examiner*—D. Mark Collins
*Attorney, Agent, or Firm*—Skjerven, Morrill, MacPherson, Franklin & Friel LLP; David T. Millers

[57] ABSTRACT

A jig for a fusion bonding process includes a sealable chamber having a first station for a first wafer and a second station for a second wafer. The wafers are initially separated from each other while a vacuum is created in the chamber. In one embodiment of the invention, movably mounted spacers separate the wafers while the vacuum is formed. The spacers are then moved to allow the wafers to come into contact and form an initial bond. In another embodiment, wafers in the first and second stations are tilted away from each other so that gravity keeps the wafers separated while the vacuum is formed. After the vacuum is formed, the chamber is rotated so that gravity pushes the two wafers together. In either embodiment, a mechanical pushing system or vibrational energy can apply force to induce or improve the initial bond. The initial bond seals cavities formed between the wafers. The jig can be transparent to infrared radiation or visible light to allow inspection of the initial bond and the sealing of the cavities. If the cavities are sealed, the wafers are removed from the chamber for annealing which strengthens the bond between the wafers. The cavities between the wafers inherit from the chamber a vacuum that helps to keep the wafers together during annealing.

23 Claims, 11 Drawing Sheets

PROCESS FOR WAFER BONDING IN A VACUUM

BACKGROUND

1. Field of the Invention

This invention relates to devices and methods for bonding of semiconductor wafers.

2. Description of Related Art

Fusion bonding can bond two semiconductor wafers together to form sealed cavities between the wafers. U.S. Pat. Ser. No. 4,883,215 to Goesele et al., which is hereby incorporated by reference in its entirety, describes a known fusion bonding process such as illustrated in FIG. 1A. The bonding process bonds a first wafer 110 having a surface with a depression to a second wafer 120 to form a sealed cavity 115. In addition to the depression, wafer 110 may include semiconductor elements constructed in and on its surface before the fusion bonding. Wafer 120 is a uniform structure such as an unprocessed wafer so that alignment of wafers 110 and 120 is not critical. Alternatively, structures in and on wafer 120 are aligned with structures in and on wafer 110 in an aligned fusion bonding process such as described in U.S. Pat. Ser. No. 5,273,118 to Bower et al., which hereby is incorporated by reference herein in its entirety.

A conventional two-step fusion bonding of wafers 110 and 120 takes place in an ambient that is about 90% or more oxygen at atmospheric pressure. A first step of the process places cleaned smooth surfaces of wafers 110 and 120 in contact to form an initial bond in a bond area 112. The initial bond is due to water-hydrogen bonding and seals the oxygen rich gas in cavity 115. A second step is annealing at an elevated temperature, about 1000 ° C., to form a strong chemical bond between wafers 110 and 120. During annealing, oxidation of the interior surfaces of cavity 115 consumes the oxygen in cavity 115.

During the bonding process, the bonding surfaces of the two wafers must be kept in contact. Otherwise, bubbles can form between bonding surfaces in area 112, and cavity 115 may not seal. For wafers 110 and 120 to stay together until the bonding process is complete, forces on wafers 110 and 120 must satisfy Equation 1 throughout the bonding process.

$$FA+FB>FG \quad \text{Equation 1}$$

In Equation 1, FA is the force of the exterior or ambient pressure pressing wafers 110 and 120 together; FB is the bonding force in area 112 which holds wafers 110 and 120 together; and FG is the outward force of the gas trapped in cavity 115. For Equation 1 to hold, the combination of the bonding force FB and the force of the ambient FA must be larger than the force FG of the trapped gas. Increasing the size of bonding area 112 increases force FB but also increases device area and costs. Force FG is proportional to the total number of gas molecules in cavity 115 and increases linearly with temperature. The number of gas molecules in cavity 115 depends on the ambient surrounding wafers 110 and 120 during the initial wafer bonding. During annealing, the elevated temperature increases force FG until oxidation of the interior surfaces of cavity 115 consumes oxygen molecules and reduces the pressure in cavity 115 and force FG. Ideally, a vacuum forms in cavity 115 when all the oxygen and any other gases in cavity 115 are consumed. Wafer 120 can then be thinned and shaped to form semiconductor devices such as described in U.S. Pat. No. 5,576, 251, to Garabedian et al., which hereby is incorporated by reference herein in its entirety.

Although known fusion bonding processes are suitable for manufacturing of such devices, processes and tools that simplify fusion bonding, reduce the required bonding area, and are inexpensive to implement are still desired.

SUMMARY

In accordance with an aspect of the invention, an initial bond between two wafers is formed in a vacuum (or near vacuum) so that pressure in the cavities between the two wafers is low. Accordingly, the force FG is small, and Equation 1 is satisfied for the remainder of a bonding process. An inexpensive jig for the initial bonding of the wafers includes a chamber with an area for a first wafer and spacers that can be moved into position over the first wafer. The spacers support a second wafer that is over but initially separated from the first wafer. After loading the first and second wafers in the chamber, the chamber is sealed and evacuated to form a near vacuum. The chamber may be purged with oxygen before a final evacuation. The spacers are then moved to allow bonding surfaces of the wafers to come in contact and form an initial bond. The initial bond seals cavities between the wafers and encloses a near vacuum in the cavities as inherited from the evacuated chamber. The wafers can then be heated to transform the initial bond to a stronger covalent chemical bond characteristic of fusion bonding.

In accordance with another aspect of the invention, the spacers are rotatably mounted and weighted so that when the jig is tilted, gravitational forces rotate the spacers between a configuration where portions of the spacers are between the two wafers to a configuration where the wafers slip into contact with each other. Such spacers are low cost, do not affect the vacuum seal of the chamber containing the wafers, and do not contaminate the bond surfaces of the wafers. Alternatively, devices in the jig can apply forces such as electric or pneumatic forces to move the spacers.

The jig may additionally include a system for forming a good initial bond before the wafers are removed from the vacuum chamber. For example, to form the initial bond, a mechanical system may include a push rod that is manually, electromagnetically, or pneumatically activated or an inflatable bladder that inflates to press the wafers together. Alternatively, transfer of vibrational energy from tapping the jig or from an ultrasonic or vibrational generator seats the wafers against each other for a good initial bond. The jig may be made of a material that is transparent to infrared radiation or visible light to allow visual inspection of the initial bond before the wafers are removed from the vacuum chamber for subsequent processing.

Another embodiment of the invention provides a tool having two plates, where each plate includes a depression for the loading of a wafer. The plates are mounted to provide three relative orientations. In a first orientation, the plates are separated from each other to permit loading of two wafers, one in each depression. The second orientation brings the plates in contact with each other so that the depressions form a sealed volume with wafers separated from each other on opposite sides of the volume. A vacuum can be formed in the sealed volume while the plates have the second orientation. While the plates remain in contact and the volume contains a vacuum, the plates are rotated to a third orientation where gravity brings the wafers in contact with each other forming an initial bond between the wafers. The initial bond seals between the wafers, forming a cavity that contains a vacuum.

To provide the three orientations, hinges can attach the two plates to a rotating base. The first orientation corresponds to the hinges being open to permit loading of wafers. For the second orientation, the hinges close to bring the plates in contact with the wafers being nearly vertical. For the third orientation, the base rotates the plates while the hinges remain closed. The rotation of the base moves the wafers toward horizontal and allows gravity to slide one wafer into contact with the other wafer.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1A:
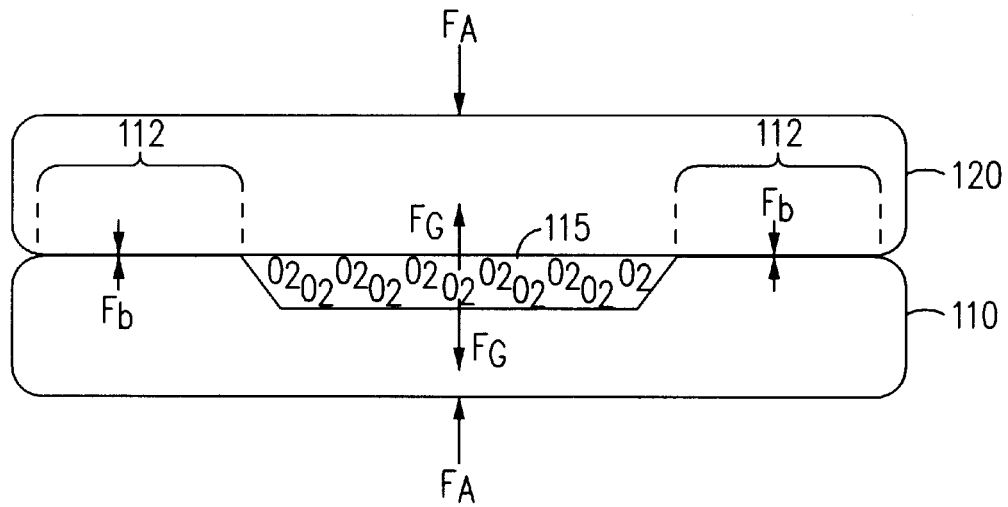
FIGS. 1A and 1B respectively illustrate conventional and new initial fusion bonding processes.
Figure 1B:
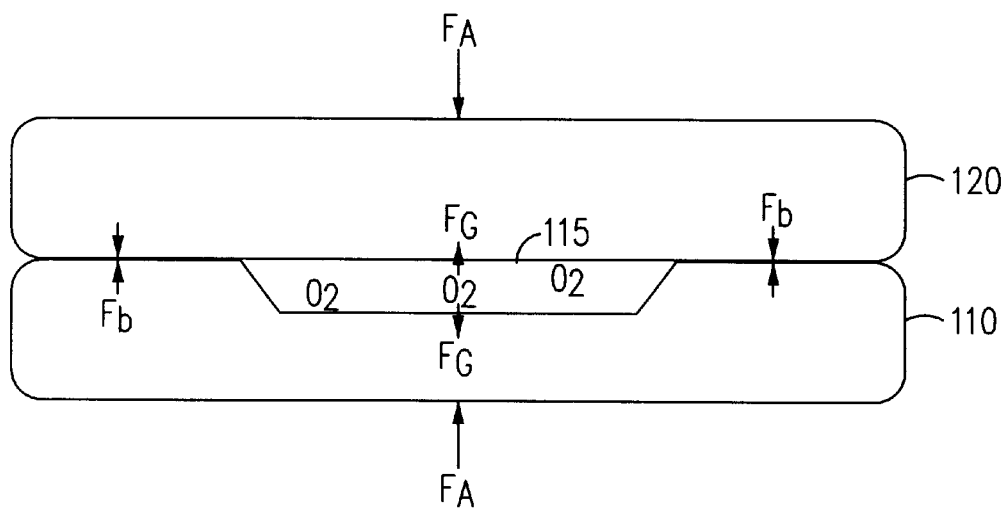

In accordance with an aspect of the invention, a fusion bonding process as illustrated in FIG. 1B performs initial bonding in a vacuum or near vacuum to avoid trapping gases at significant pressure in cavities 115 between wafers 110 and 120. Accordingly, the force FG from trapped gas is small compared to the ambient force FA, and the bonding force FB required to keep wafers together is less. Accordingly, the fusion bonding process permits smaller bonding areas and minimizes the device area and the number of defects in seals formed around cavities 115. An inexpensive jig for this process includes movable spacers that separate wafers 110 and 120 before the initial bonding. A vacuum (or near vacuum) is then created around and between the wafers, and the spacers are removed from between the two wafers to allow bonding surfaces of the wafers to come into contact and create the initial bond. Since the initial bonding occurs in a vacuum, gas pressure in cavities 115 is small. Removal of the spacers from between the wafers can be accomplished using gravitational forces to rotate weighted spacers when the jig is properly inclined. Gravitational movement of the spacers eliminates the need for active mechanisms to move the spacers and for vacuum seals associated with such mechanisms.

Figure 2A:
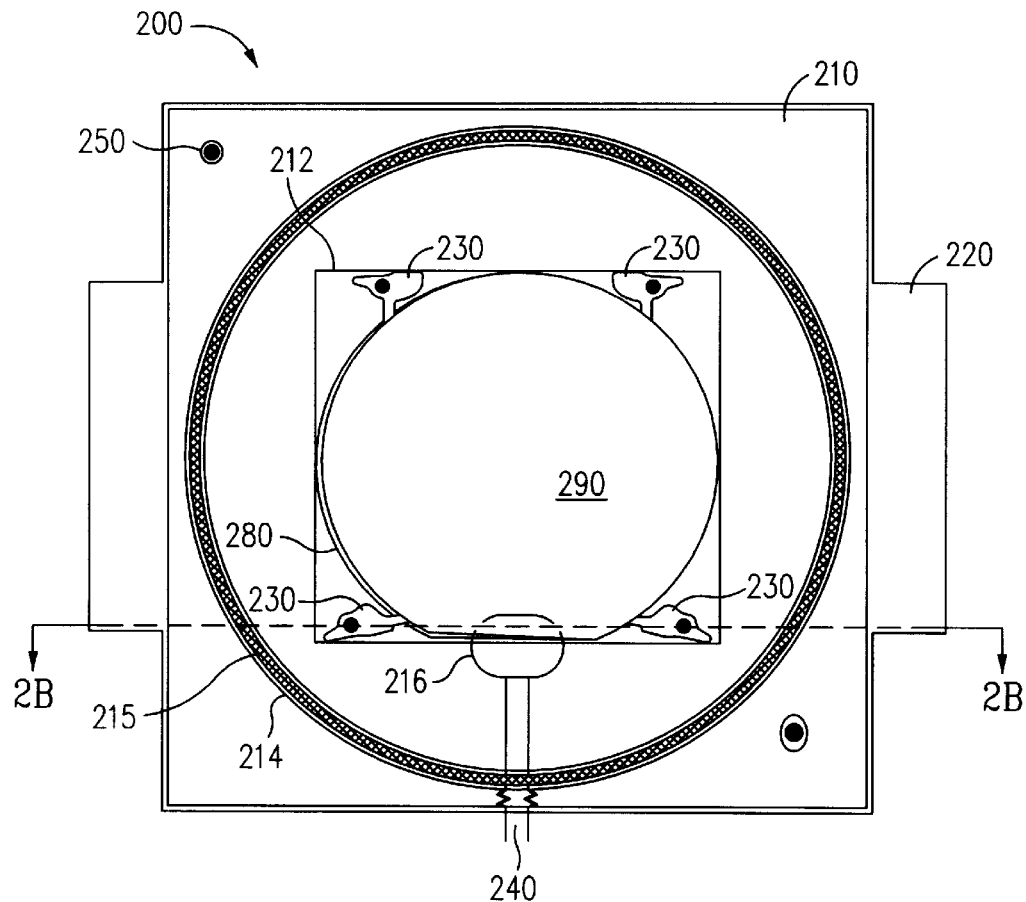
FIGS. 2A and 2B respectively show top and cross-sectional views of a wafer bonding jig in accordance with an embodiment of the invention.
Figure 2B:
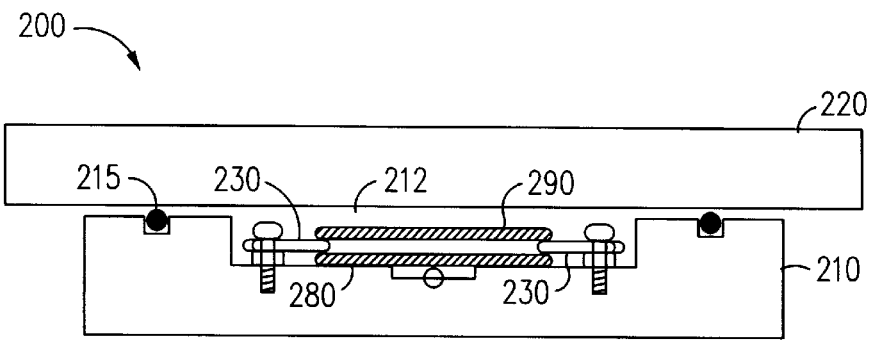

FIGS. 2A and 2B respectively show top and cross-sectional views of a jig 200 for a fusion bonding process in accordance with an embodiment of the invention. Jig 200 includes a bottom plate 210 having a depression for two stacked wafers 280 and 290, an o-ring 215, and a top plate 220 that seats against bottom plate 210 and o-ring 215 to seal a chamber 212. Lower plate 210 includes an inlet/outlet 240 and a tweezer groove 216. Inlet/outlet 240 provides a conduit for purging gases and evacuating chamber 212. Tweezer grove 216 facilitates loading and unloading of wafers in chamber 212. Rotatable wafer spacers 230 in chamber 212 separate wafers 280 and 290 before a vacuum is created in chamber 212.

Accordingly, spacers 230 are offset from a bottom of chamber 212 so that wafer 280 fits in an area beneath spacers 230. For jig 200, spacers 230 are weighted or shaped so that when jig 200 is inclined at the proper angle, gravity rotates spacers 230 causing a portion of each spacer 230 to enter or leave the area over wafer 280. Alternatively, a drive system can rotate or otherwise move spacers 230 to the same effect. For example, an electrically or pneumatically operated drive mechanism can move spacers 230 from a configuration where portions of spacers 230 separate wafers 280 and 290 to a configuration where bonding surfaces of wafers 280 and 290 contact each other.

Figure 3A:
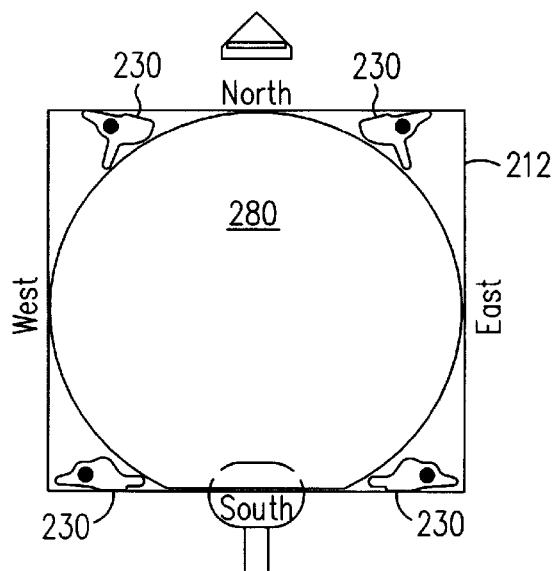
FIGS. 3A, 3B, 3C, and 3D illustrate a vacuum fusion bonding process in accordance with an embodiment of the invention.

FIGS. 3A to 3D illustrate a fusion bonding process using jig 200. Initially, conventional techniques prepare wafers 280 and 290 for fusion bonding. For example, wafers 280 and 290 have smooth (e.g., mirror polished) bonding surfaces that are cleaned in acid and base baths, rinsed, and spun dry as described in U.S. Pat. Ser. No. 4,883,215 or 5,236,118 to provide smooth clean bonding surfaces. Removing or otherwise moving top plate 220 provides access to chamber 212 for loading and unloading of wafers 280 and 290. For loading of wafer 280, jig 200 is tilted to an angle where spacers 230 permit placing of wafer 280 at the bottom of chamber 212 with the bonding surface of wafer 280 facing up. In FIG. 3A, the shapes of spacers 230 weight spacers 230 to rotate out of the way of wafer 280 when a north edge of jig 200 is raised to incline jig 200 at a sufficient angle from horizontal. A primary flat in the perimeter of wafer 280 is against a south edge of chamber 212.

Figure 3B:
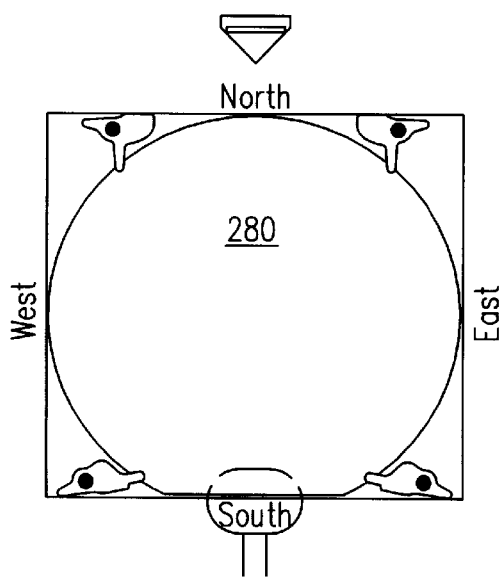
Figure 3C:
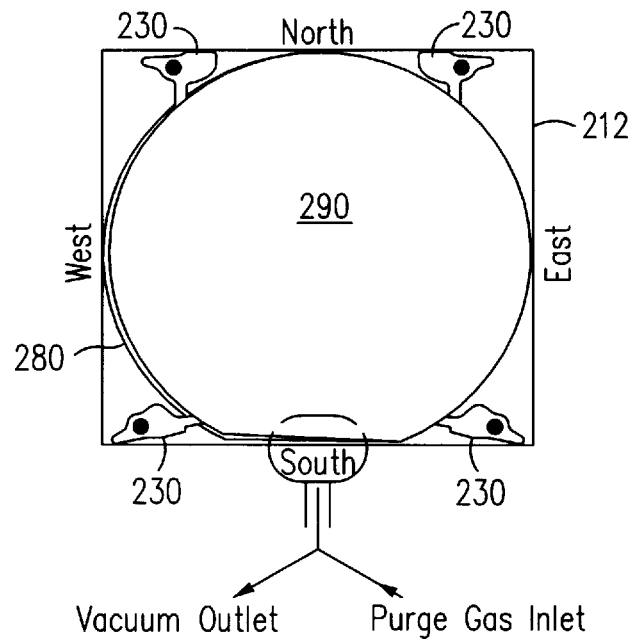
Figure 3D:
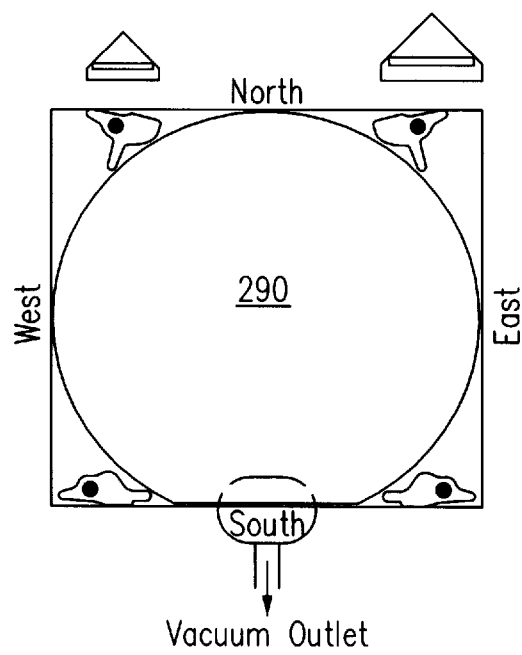

As shown in FIG. 3B, the north edge of jig 200 is then tilted down past horizontal so that each spacer 230 rotates to insert a tab portion of the spacer 230 over wafer 280. Jig 200 can then be raised to horizontal or left inclined for loading of wafer 290. Wafer 290 is placed on spacers 230 in chamber 212 as shown in FIG. 3C. In chamber 212, a primary flat in the perimeter of wafer 290 is toward the south wall of chamber 212, and the bonding surface of wafer 290 is facing down. Spacers 230 separate the bonding surfaces of wafers 280 and 290 from each other to prevent initial bonding. Top plate 220 is then aligned with and attached to lower plate 210 to seal chamber 212. Alignment holes and pins 250 are provided in plates 210 and 220 so that upper plate 220 properly seats against o-ring 215 to seal chamber 212. Gases are then evacuated from chamber 212 through inlet/outlet 240. Chamber 212 can be purged with oxygen before or during the evacuation process. For example, chamber 212 can be filled with oxygen to a pressure of about 75% of the outside pressure (i.e., about 0.75 ATM) and then evacuated to return chamber 212 to the vacuum. After several purge cycles, chamber 212 is at vacuum or a near vacuum with pressure of about 0.05 ATM or less, and the residual gas in chamber 212 is nearly 100% oxygen.

After the vacuum (or more accurately near vacuum) is established in chamber 212, the north side ofjig 200 is slowly raised to incline jig 200 at an angle that causes spacers 230 to rotate out from between wafers 280 and 290.

In the tilting process, the primary flats of wafers 280 and 290 move to the south wall of chamber 212, aligning wafers 280 and 290 for bonding. If necessary, tapping or vibrating jig 200 can induce spacers 230 to move out from between wafers 280 and 290 and allow the bonding surfaces of wafers 280 and 290 to come into direct contact and form an initial bond. The initial bond is believed to result from the union of dangling hydrogen bonds left on the smooth bonding surfaces during the cleaning process.

Figure 4A:
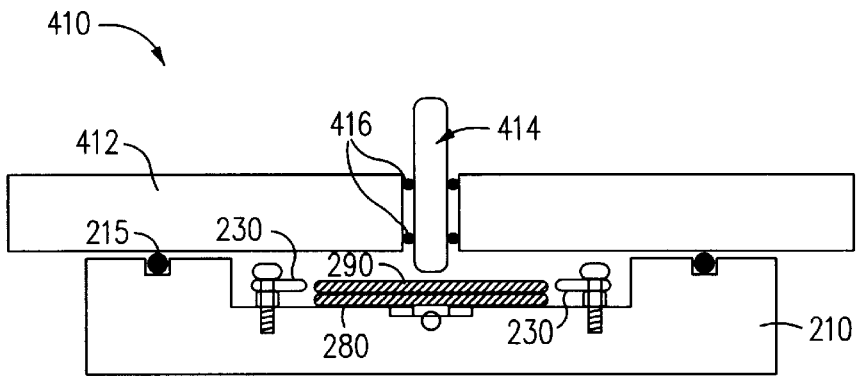
FIGS. 4A, 4B, 4C, 4D, 4E, and 4F illustrate jigs in accordance with embodiments of the invention that have systems for initiating a good initial bond between two wafers.
Figure 4B:
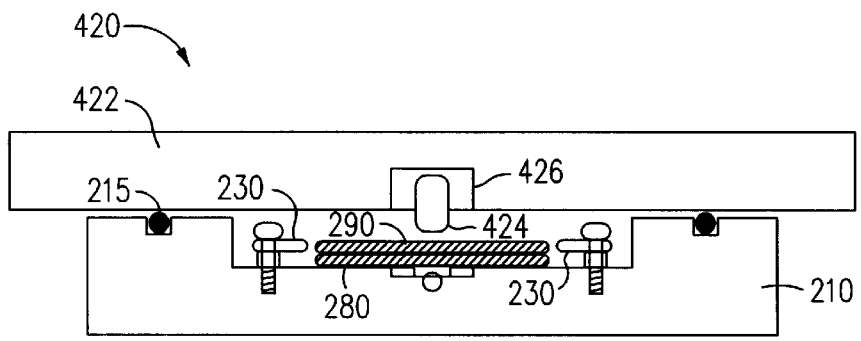

The flatness of wafers 280 and 290 determines whether the initial bonding occurs immediately upon direct contact. If initial bonding does not occur or if large voids exist after initial bonding, formation of a good initial bond can be induced. FIGS. 4A to 4F illustrate systems for inducing a good initial bond that seals any cavities formed between wafers 280 and 290. A mechanical method for inducing an initial bond pushes wafers 280 and 290 together. FIG. 4A shows a jig 410 where a top plate 412 includes an opening for a push rod 414. When spacers 230 are in a configuration allowing wafer 290 to contact wafer 280, manually pushing on push rod 414 from outside jig 410 pushes wafer 290 onto wafer 280. A vacuum seal 416 (for example, o-rings) prevents leakage through the opening in top plate 412 and preserves the vacuum in chamber 212. Alternatively, as illustrated in FIG. 4B, a top plate 422 of a jig 420 includes a device 426 which pushes a push rod 424 into wafer 290. Device 426 can be an electromechanical device (such as a spring loaded solenoid or a piezoelectric transducer) which moves push rod 424 or a pneumatic device (such as a hydraulic or air cylinder and piston). Device 426 may be easier to incorporate into vacuum sealed chamber 212 but is typically more expensive than the manually operated push rod 414 of FIG. 4A.

Figure 4C:
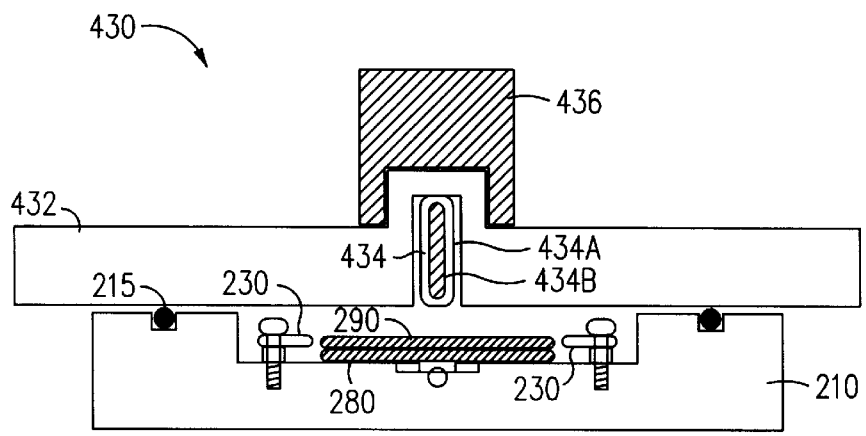
Figure 4D:
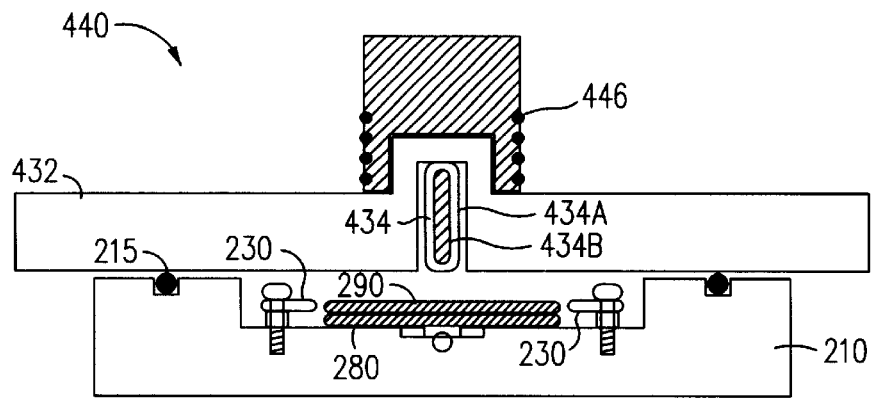

FIGS. 4C and 4D illustrate jigs 430 and 440 having a magnetically operated rod 434. Rod 434 fits within a slot in a top plate 432 and contains a core 434B of a magnetic material such as magnetized or unmagnetized iron surrounded by a coating 434A of an ultra-clean material such as Teflon. In jig 430 of FIG. 4C, a permanent magnet 436 when appropriately positioned above top plate 432 attracts rod 434 into the slot, keeping rod 434 away from wafer 290. When permanent magnet 436 is removed, rod 434 falls into contact with wafer 290 and helps initiate the fusion bond between wafers 290 and 280. Alternatively, when core 434B is magnetized, reversing the orientation of magnet 436 can create a magnetic repulsion between magnet 436 and rod 434 that pushes rod 434 into contact with wafer 290. Instead of a permanent magnet such as magnet 436, jig 440 of FIG. 4D employs an electromagnet 446. If core 434B is unmagnetized magnetic material, energizing electromagnet 446 attracts rod 434 into the slot in top plate 432, and turning electromagnet 446 off allows rod 434 to fall into contact with wafer 290. If core 434B is magnetized, energizing electromagnet 446 either attracts rod 434 into the slot in top plate 432 or pushes rod 434 onto wafer 290 depending on the polarity of the current energizing electromagnet 446.

Figure 4E:
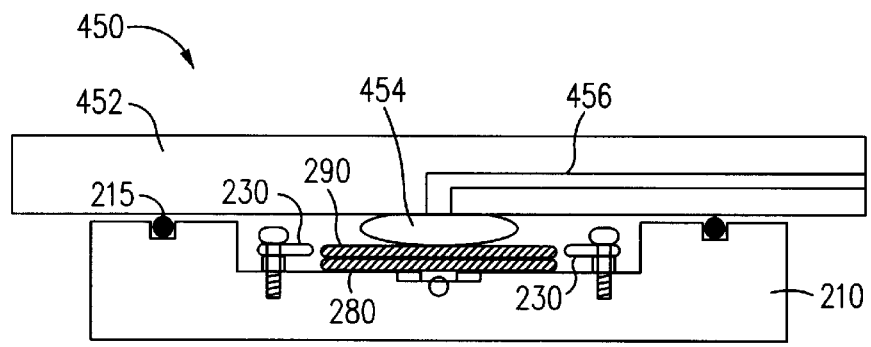

FIG. 4E shows a jig 450 employing yet another alternative mechanical system for initiating the bonding of wafers 280 and 290. Jig 450 has an inflatable bladder 454 within the sealed cavity formed by jig 450. In the embodiment shown, bladder 454 is mounted on a top plate 452 having an inlet/outlet 456 for inflating and deflating bladder 454. Bladder 454 when inflated expands to contact wafer 290 and push wafer 290 onto wafer 280.

Figure 4F:
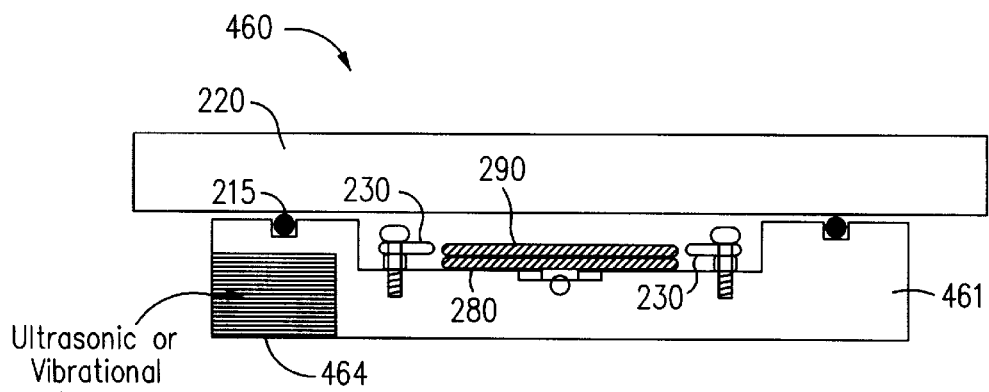

Another method in accordance with the invention transfers vibrational energy to wafers 280 and 290 to induce the initial bond. The vibrational energy can cause a better seating of wafer 280 with respect to wafer 290 for a better initial bond. Tapping, shaking, or otherwise jarring jig 200 is a simple way to transfer vibrational energy. Alternatively, an ultrasonic or vibrational device 464 such as shown in FIG. 4F can be mounted in a bottom plate 461 of a jig 460. When activated, device 464 imparts ultrasonic or vibrational energy to jig 460 and wafers 280 and 290. Device 464 has the advantage of not requiring a vacuum seal since device 464 does not create a fluid path from chamber 212 and can be mounted anywhere on jig 460.

Figure 5:
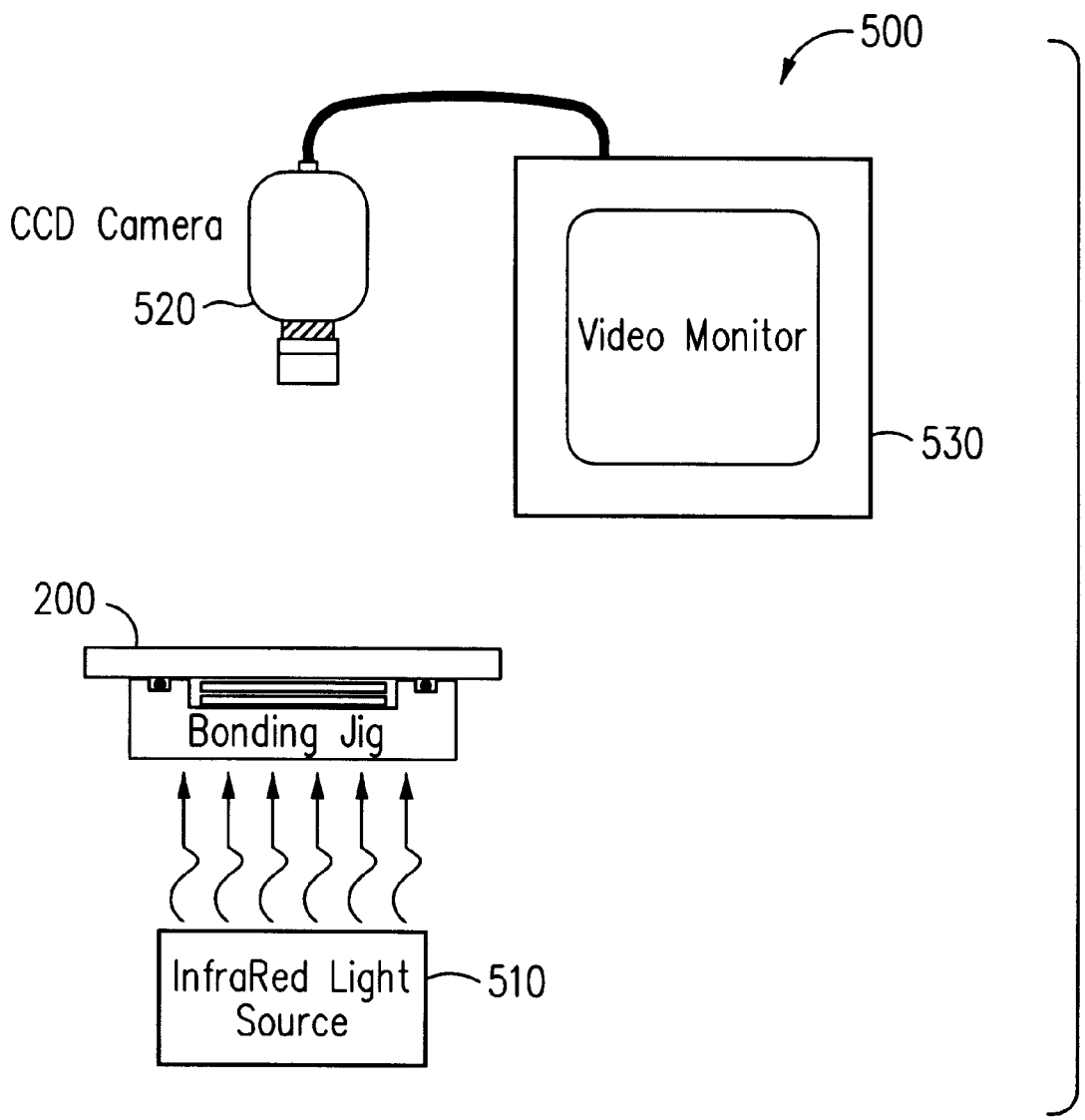
FIG. 5 illustrates a wafer bonding system with an infrared inspection in accordance with an embodiment of the invention.

Before removal from any of the above described jigs, the initial bond between wafers 280 and 290 can be inspected. FIG. 5 shows an example of an infrared station 500 for inspecting wafers in jig 200. Infrared station 500 consists of an infrared radiation source 510, an infrared sensitive camera 520, and a monitor 530. For use with infrared station 500, bottom and top plates 210 and 220 should be made of a material that is transparent to infrared radiation. With infrared station 500, the initial bond between wafers 280 and 290 can be observed if wafers 280 and 290 are of a semiconductor material (such as silicon) that is nearly transparent to infrared radiation. Alternatively, if no infrared inspection station is available, jig 200 can be made of a material that is transparent to visible light to allow direct visible inspection of the initial bond of wafers 280 and 290 at least from a side view. In an exemplary embodiment of the invention, bottom and top plates 210 and 220 are made of polysulfone which is transparent to infrared radiation and visible light.

The initial bonding of wafers 280 and 290 seals a vacuum in any cavities formed between wafers 280 and 290. Accordingly, wafers 280 and 290 can be removed from jig 200 for high temperature annealing which transforms the initial bond to a stronger covalent chemical bond. A typical annealing process may subject wafers 280 and 290 to an oxygen, nitrogen, or clean air ambient at 1000° C. for 30 minutes. Since the cavities between wafers 280 and 290 initially contain a vacuum (or a low gas pressure), force FG which is due to the trapped gas pressure is small, and the ambient pressure (i.e., force FA) holds wafers 280 and 290 together. Accordingly, the annealing is less likely to disrupt the initial bond or create bubbles in the bonding area.

Figure 6A:
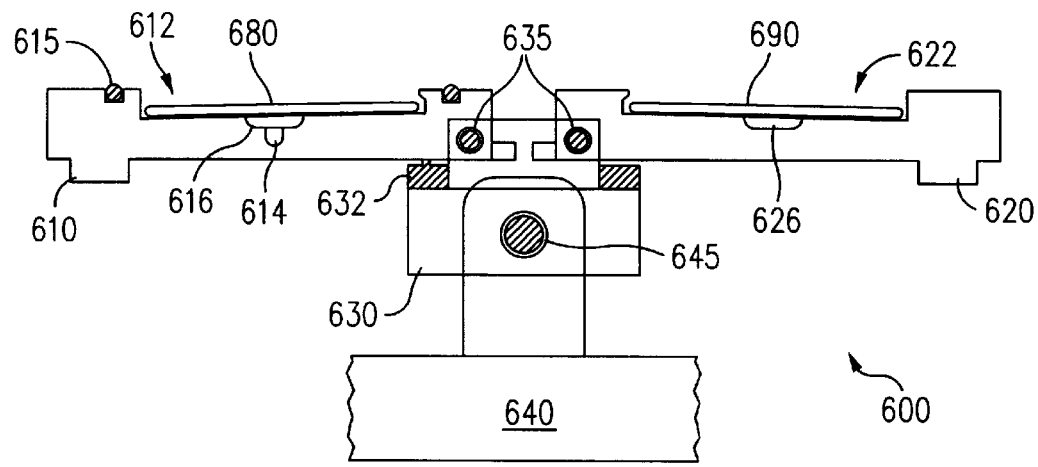
FIGS. 6A and 6B respectively show a front view and a top view of a wafer bonding jig that does not require spacers to separate wafers.
Figure 6B:
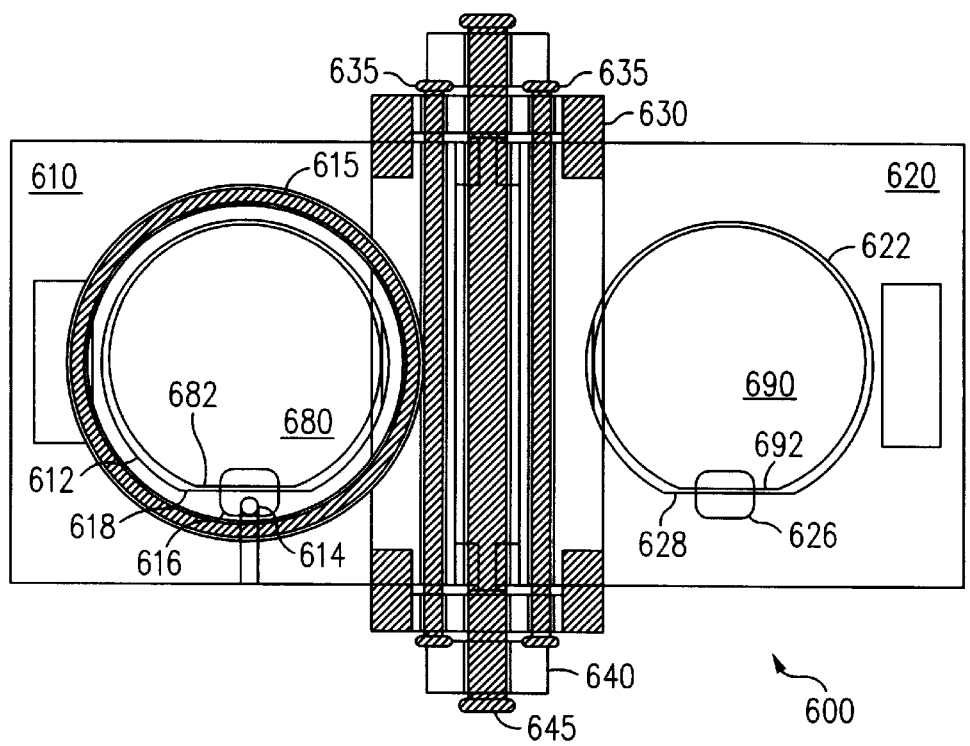

FIGS. 6A and 6B respectively show a cross-sectional front view and a top view of a wafer bonding jig 600 in accordance with another embodiment of the invention. Jig 600 includes a left plate 610 and a right plate 620 that are made of any suitable material including but not limited to materials transparent to visible or infrared light as described above. Plates 610 and 620 are mounted on a rotating base 630. A locking hinge 645 attaches rotating base 630 to a fixed base 640 and allows rotating base 630 to rotate both plates 610 and 620 in the same direction simultaneously. Hinge pins 635 allow plates 610 and 620 to rotate into contact with each other so that depressions 612 and 622 in respective plates 610 and 620 form a closed volume or rotate away from each other for loading of wafers 680 and 690 into respective depressions 612 and 622. When plates 610 and 620 are in contact, an o-ring 615 mounted on plate 610 helps seal the closed volume and a gas inlet/outlet 614 in plate 610 permits purging and evacuating of the closed volume. When plates 610 and 620 are separated, wafer tweezer grooves 616 and 626 in depressions 612 and 622 facilitate loading and unloading of wafers 680 and 690. As shown in the top view of FIG. 6B, depressions 612 and 622 have respective flat sides 618 and 628 against which primary flats 682 and 692 rest to align wafers 680 and 690 for initial bonding. Depressions 612 and 622 also have bottom surfaces that are inclined up toward hinge pins 635 and down toward flat sides 618 and 628. As described further below, gravity pushes wafers 680 and 690 against the inclined surfaces when plates 610 and 620 are horizontal and separated from each other and when plates 610 and 620 are vertical and in contact with each other.

Figure 7A:
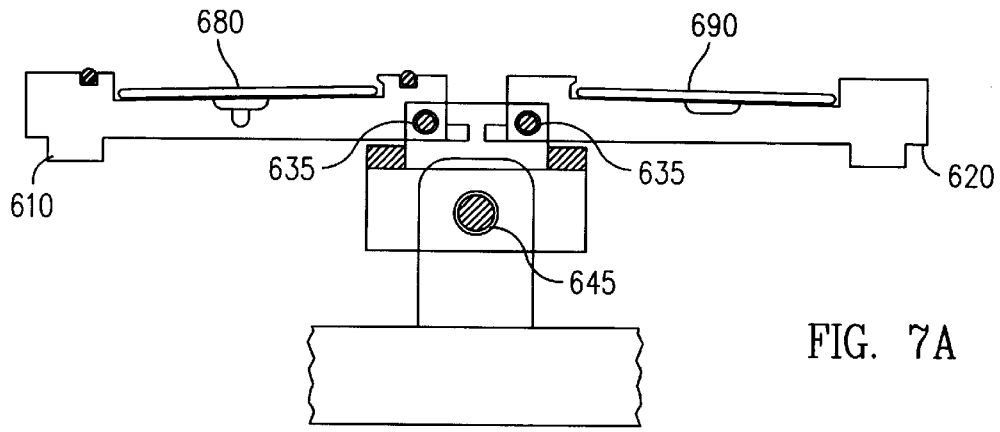
FIGS. 7A, 7B, and 7C illustrate a process for using the jig of FIG. 6A to form an initial bond between wafers in a fusion bonding process.
Figure 7B:
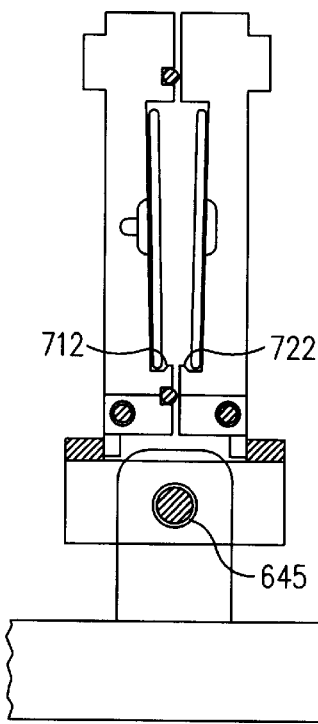
Figure 7C:
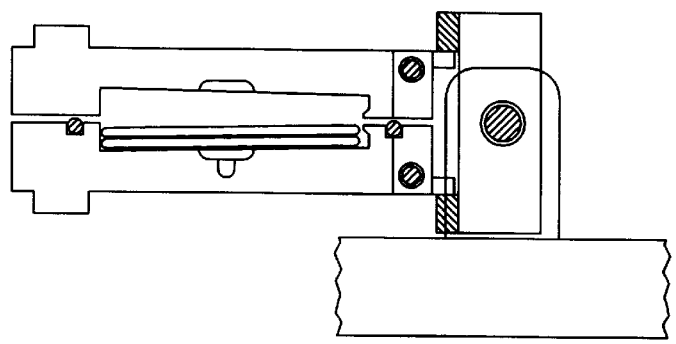

FIGS. 7A, 7B, and 7C illustrate a process for using jig 600 to form an initial bond between wafers. As shown in FIG. 7A, plates 610 and 620 are initially opened away from each other for loading of clean and dry wafers 680 and 690 into respective depressions 612 and 622. Plates 610 and 620 are then rotated about hinge pins 635 until plates 610 and 620 meet in an upright position as shown in FIG. 7B. The inclined surfaces at the bottoms of depressions 612 and 622 cause wafers 680 and 690 to lean away from each other while plates 610 and 620 are in the upright position. Additionally, edges 712 and 722 in respective depressions 612 and 622 may include notches to prevent wafers 680 and 690 from slipping out as plates 610 and 620 rotate to the upright position. Locking hinge 645 prevents movement of rotating base 630 while plates 610 and 620 move to the upright position. While plates 610 and 620 are in the upright position, depressions 612 and 622 form a closed volume which is evacuated to form a vacuum. If desired, the closed volume can be purged with pure oxygen before being evacuated. The purge and vacuum cycles can be repeated as desired so that any residual gas in the close volume is pure oxygen.

While the vacuum remains in the closed volume, locking hinge 645 is released, and base 630 rotates plates 610 and 620 to a horizontal orientation as shown in FIG. 7C. In this orientation, wafer 690 slip into contact with wafer 680, and gravity pushes wafers 680 and 690 together. Depending on the flatness of wafers 680 and 690, wafers 680 and 690 may form an initial bond upon contact or may require some initiation. Several methods for inducing or improving the initial bond are described above and illustrated in FIGS. 4A to 4F.

Figure 8A:
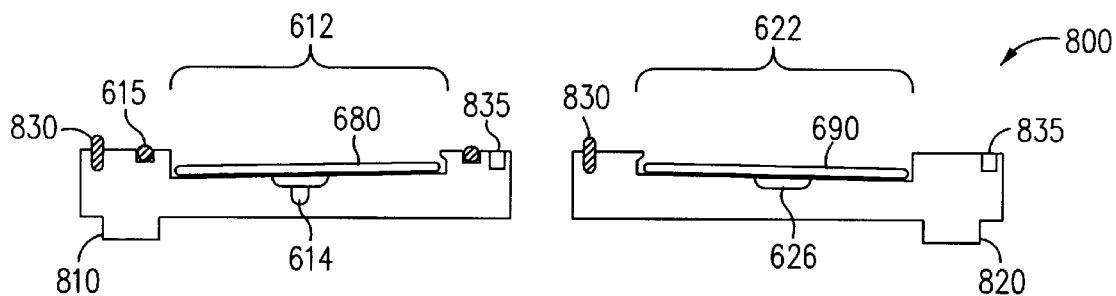
FIGS. 8A and 8B respectively show a front view and a top view of another wafer bonding jig that does not require spacers to separate wafers.
Figure 8B:
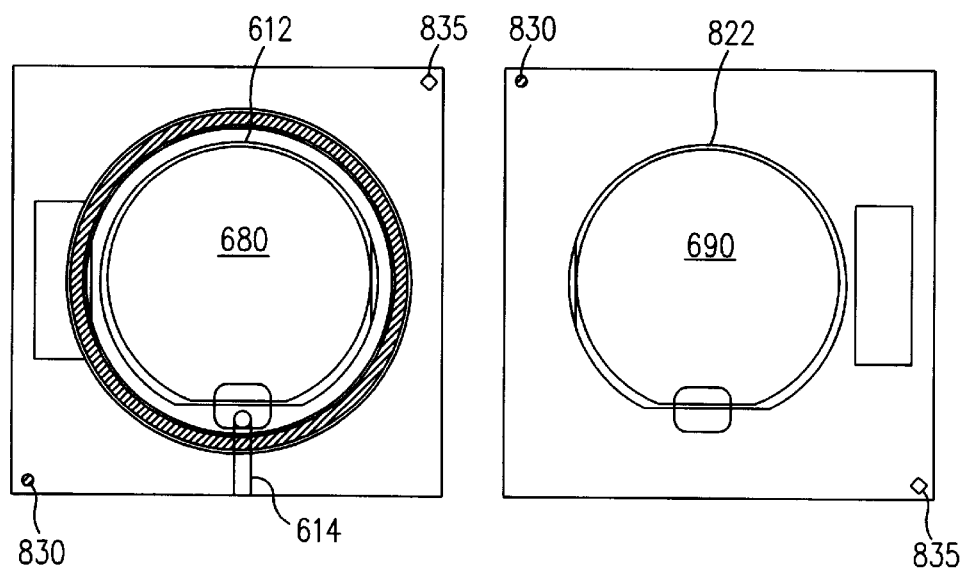

FIGS. 8A and 8B respectively show a cross-sectional front view and a top view of another wafer bonding jig 800. Jig 800 includes a pair of plates 810 and 820 having depressions 612 and 622 for wafers 680 and 690. Depressions 612 and 622 in plates 810 and 820 are substantially the same as the depressions in plates 610 and 620, but unlike plates 610 and 620, plates 810 and 820 are not mounted to a base. Plates 810 and 820 can be manually brought into contact and rotated. Each of plates 810 and 820 has an alignment pin 830 that corresponds to an alignment slot 835 in the other plate 820 or 810. Alignment pins 830 fit into the corresponding alignment slots 835 when plates 810 and 820 are brought into contact to form a closed volume.

Figure 9A:
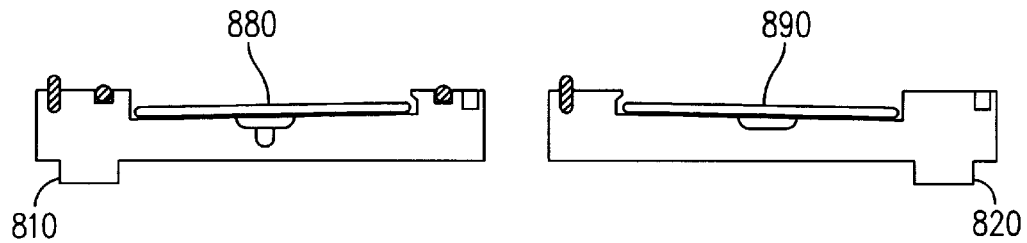
FIGS. 9A, 9B, and 9C illustrate a process for using the jig of FIG. 8A to form an initial bond between wafers in a fusion bonding process.
Figure 9B:
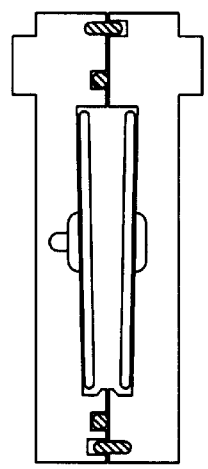
Figure 9C:
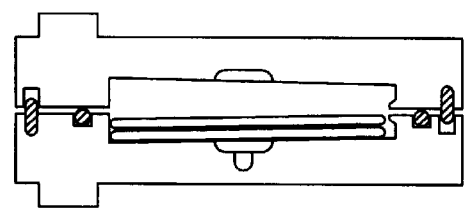

FIGS. 9A, 9B, and 9C illustrate a process for using jig 800 to form an initial bond between wafers 680 and 690. Initially, as shown in FIG. 9A, plates 810 and 820 are horizontal and separated from each other for loading of clean dry wafers 680 and 690 in respective depressions 612 and 622 of plates 810 and 820. Plates 810 and 820 are then rotated to vertical and brought together so that alignment pins 830 are in matching alignment slots 835. As described above, notches in side walls and inclined bottom surfaces of depressions 612 and 622 help to stop wafers 680 and 690 from slipping and coming into contact while plates 810 and 820 are vertical. FIG. 9B shows the configuration of plates 810 and 820 when vertical and in contact with each other A vacuum is introduced into the closed volume that depressions 612 and 622 form while plates 810 and 820 are vertical and in contact. As described above, the vacuum can be formed by repeatedly purging the closed volume with oxygen and then evacuating the closed volume. After the vacuum is created in the closed volume containing wafers 680 and 690, plates 810 and 820 are rotated to a horizontal orientation shown in FIG. 9C. Wafers 680 and 690 come into contact while in a vacuum. Depending on the flatness of wafers 680 and 690, wafers 680 and 690 may immediately form a suitable initial bond or one of the methods described above can be used to induce a better initial bond.

Although the invention has been described with reference to particular embodiments, the description is only an example of the invention's application and should not be taken as a limitation. Various adaptations and combinations of of the embodiments disclosed are within the scope of the invention as by the following claims.

We claim:

1. A wafer bonding process comprising:

forming a vacuum around a first wafer and a second wafer while a bonding surface of the first wafer is separated from a bonding surface of the second wafer; and while the first and second wafers are in the vacuum, moving the first wafer relative to the second wafer to place the bonding surface of the second wafer in contact with the bonding surface of the first wafer to create a bond between the first and second wafers.

2. The wafer bonding process of claim 1, further comprising positioning the first and second wafers in a chamber so that the first and second wafers are tilted away from each other while the bonding surface of the first wafer is separated from the bonding surface of the second wafer, wherein placing the bonding surfaces of the first and second wafers in contact comprises rotating the chamber so that gravity pushes the first wafer into the second wafer.

3. The wafer bonding process of claim 1, further comprising:

placing spacers between the first and second wafers while the bonding surface of the first wafer is separated from the bonding surface of the second wafer; and removing the spacers from between the first and second wafers to allow placing of the bonding surfaces in contact.

4. The method of claim 1, further comprising forming a cavity in the first wafer, wherein placing the bonding surface of the second wafer in contact with the bonding surface of the first wafer seals the cavity.

5. The method of claim 1, further comprising exposing the first and second wafers to an elevated temperature to strengthen the bond between the first and second wafers.

6. The method of claim 1, further comprising purging a chamber containing the first and second wafers with oxygen before evacuating the chamber so that any trace gases left in the vacuum sealed cavity are predominantly oxygen.

7. The method of claim 1, further comprising exposing the first and second wafers to an elevated temperature to strengthen the bond between the first and second wafers.

8. The method of claim 1, further comprising purging a chamber containing the first and second wafers with oxygen before evacuating the chamber so that any trace gases in the near vacuum are predominantly oxygen.

9. A wafer bonding process comprising:

placing a first wafer in a chamber;

placing a second wafer on spacers that are in the chamber, wherein the spacers separate a first bonding surface of the first wafer from a second bonding surface of the second wafer;

sealing the chamber;

forming a vacuum in the chamber surrounding the first and second wafers; and removing the spacers from between the first and second wafers, wherein removing the spacers allows the first bonding surface to contact the second bonding surface while the vacuum surrounds the first and second wafers.

10. The process of claim 9, wherein removing the spacers comprises tilting the chambers so that gravitational forces remove the spacers from between the wafers.

11. The process of claim 10, wherein the spacers are rotatably mounted, and the gravitational force rotates the spacers to move portions of the spacers out from between the first and second wafers.

12. The process of claim 9, where removing the spacers comprises activating a device that applies an electromagnetic or electrostatic force that removes the spacers from the between the first and second wafers.

13. The process of claim 9, where removing the spacers comprises activating a device that applies a pneumatic force that removes the spacers from the between the first and second wafers.

14. The process of claim 9, further comprising applying forces to the first and second wafers to initiate an initial bond between the first and second wafers.

15. The process of claim 14, wherein applying the forces comprises activating a push rod that contacts and pushes one of the first and second wafers toward the other of the first and second wafers.

16. The process of claim 15, wherein the push rod is manually operated.

17. The process of claim 15, wherein the push rod is pneumatically operated.

18. The process of claim 15, wherein the push rod is electrically operated.

19. The process of claim 15, wherein the push rod is magnetically operated.

20. The process of claim 14, wherein applying the forces comprises inflating a bladder that contacts and pushes one of the first and second wafers toward another of the first and second wafers.

21. The process of claim 14, wherein applying the forces comprises imparting vibrational energy to the first and second wafers.

22. The process of claim 21, wherein imparting vibrational energy comprises jarring the chamber containing the first and second wafers.

23. The process of claim 21, imparting vibrational energy comprises imparting ultrasonic vibrations to at least one of the first and second wafers.

* * * * *